US007864374B2

(12) United States Patent
Kondo

(10) Patent No.: US 7,864,374 B2
(45) Date of Patent: Jan. 4, 2011

(54) IMAGE FORMING METHOD AND IMAGE FORMING APPARATUS

(75) Inventor: Hirokazu Kondo, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 243 days.

(21) Appl. No.: 12/139,583

(22) Filed: Jun. 16, 2008

(65) Prior Publication Data

US 2008/0309704 A1 Dec. 18, 2008

(30) Foreign Application Priority Data

Jun. 15, 2007 (JP) ............................ 2007-159261

(51) Int. Cl.
*H04N 1/60* (2006.01)
*H04N 1/46* (2006.01)
*G03F 3/08* (2006.01)

(52) U.S. Cl. ........................ 358/1.9; 358/1.8; 358/3.23; 358/502; 358/504; 358/505; 358/523; 347/12; 347/19

(58) Field of Classification Search .................. 358/1.9, 358/1.8, 3.23, 502, 504, 505, 523; 347/43, 347/12, 19, 22, 23, 98
See application file for complete search history.

(56) References Cited

U.S. PATENT DOCUMENTS 7,219,977 B2 * 5/2007 Mitsuzawa ................... 347/43
2007/0030300 A1 * 2/2007 Jeong .......................... 347/19

FOREIGN PATENT DOCUMENTS

JP 2002-19101 A 1/2002
JP 2004-209900 A 7/2004

* cited by examiner

*Primary Examiner*—Charlotte M Baker
(74) *Attorney, Agent, or Firm*—Sughrue Mion, PLLC

(57) ABSTRACT

An image forming method that forms an image by using inks of secondary chromatic colors based on an input image, the method including: forming a test pattern that uses a color chart with the entire secondary chromatic colors of the used inks by using a normal color conversion table for converting a first color space of the input image into a second color space of the formed image; comparing data obtained by scanning the formed test pattern with second color space data of the test pattern, and identifying a non-matching color portion as a non-ejection color and a line position containing a non-ejection nozzle thereof; preparing a special color conversion table, the special color conversion table being provided for each omission ink; and setting and using the special color conversion table for an omission ink corresponding to the non-ejection color at the line position containing the identified non-ejection nozzle.

5 Claims, 3 Drawing Sheets

IMAGE FORMING METHOD AND IMAGE FORMING APPARATUS

BACKGROUND OF THE INVENTION

1. Field of the Invention

The present invention relates to an image forming method that performs image formation by an ink jet head that uses a plurality of line heads containing therein ink of secondary chromatic colors.

2. Background Art

In ink jet printers, there are a printer in which uses a short serial head and performs recording while scanning the head in the width direction of a recording medium, and a printer using a line head in which recording elements are arranged over the entire areas in the width direction intersecting the transport direction of a recording medium. In the printer using such a line head, it is not necessary to equip a transport system such as a carriage for scanning the short serial head, and control related to the movement of the carriage and complicated scanning control of the recording medium are not necessary. Furthermore, since only the recording medium is moved, it is possible to achieve higher recording speed than the printer using the serial head.

In an ink jet printer using such a line head, generally, since the nozzles have to cover the entire width of the recording medium, the number of nozzles is inevitably much more than that of the serial head, and therefore, the possibility of occurrence of a non-ejection nozzle is higher than that of a printer using the serial head. When such a non-ejection nozzle is found, stripe unevenness is formed in the direction of the relative movement of the head on the recording medium. However, in the case of the line head, from the viewpoint of efficiency, since all the colors are usually rendered during one transport, a compensation method that compensates or obviates the stripe unevenness by using inks of the same color in a plurality of scanning operations, as used in the printer using the serial head is not usable.

For this reason, in the known ink jet printers using the line head, the following compensation method is employed:

(1) An ink of a different color at the same position as the non-ejection nozzle is substituted (referred to as “different color compensation”);

(2) The amount of inks of the same color of a nozzle adjacent to the non-ejection nozzle is increased (referred to as “adjacent compensation”); and (3) A combination of the above compensation methods.

According to a different color compensation technique (JP-A-2002-019101 (the term “JP-A” as used herein means an “unexamined published Japanese patent application”)) in the known non-ejection correction method, occurrence of the non-ejection nozzle is compensated by using the method (3).

According to a recent ink jet recording technique, in order to expand a color reproduction range, a multi-color printing with five to seven colors is used in which inks of secondary chromatic colors of red (R), green (G), and blue (B) are added in a normal four-color (CMYK) printing, which uses inks of primary chromatic colors of cyan (C), magenta (M), and yellow (Y) and an ink of black (K).

As an example of a separation technique that uses such inks of secondary chromatic colors, JP-A-2004-209900 discloses a technique in which the secondary chromatic colors are used only to expand the color reproduction range. In the disclosed technique, there is a possibility that the above-described non-ejection nozzle is found in an ink jet printer using the line head, which may therefore cause stripe unevenness. Therefore, a non-ejection correction method is required which can be optimally used when a set of multi-color inks including secondary chromatic colors is used.

Although a non-ejection correction method disclosed in JP-A-2002-019101 is directed to a technique that makes stripe unevenness less conspicuous, the method is base on the assumption that the ink set is composed of inks of colors C, M, Y, and K (including light primary chromatic colors Lc and Lm). Moreover, since a multi-color ink set containing secondary chromatic colors of R, G, and B is composed of much more colors, the pattern of the stripe unevenness may become more complex; however, JP-A-2002-019101 does not disclose any construction corresponding to this, and moreover, it cannot be said to be the optimal one.

SUMMARY OF THE INVENTION

An object of the present invention is, therefore, to provide an image forming method and an image forming apparatus which are suitable for an ink jet method of a line head and capable of optimally coping with stripe unevenness resulting from a non-ejection nozzle, particularly when secondary chromatic colors are used.

The aforementioned object of the invention is achieved by the following methods and apparatuses.

(1) According to a first aspect of the present invention, an image forming method that forms an image by a plurality of ink-jet heads of line type, which contain first inks having secondary chromatic colors, based on an input image, the method including: forming a test pattern, which uses a color chart with entire colors of second inks, by the ink-jet heads while using a normal color conversion table for converting a first color space of the input image into a second color space of the formed image, the second inks including the first inks; comparing data obtained by scanning the formed test pattern with second color space data of the test pattern, and identifying a non-matching color portion as a non-ejection color and a line position containing a non-ejection nozzle thereof; preparing a special color conversion table for converting the first color space in which one color of the second inks is omitted from the normal color conversion table into a second color space reproducing a color closest to the input image, the special color conversion table being provided with respect to each omission ink; and setting and using the special color conversion table for the omission ink corresponding to the non-ejection color at the line position containing the identified non-ejection nozzle.

According to the image forming method, when performing image formation by an ink jet head based on an input image, a special color conversion table is prepared in addition to a normal color conversion table, test pattern data are compared with image formation data thereof to thereby identify a non-ejection color and a line position containing a non-ejection nozzle thereof, and a special color conversion table corresponding to an ink of the non-ejection color is applied at the line position containing the non-ejection nozzle. Therefore, it is possible to optimally coping with the stripe unevenness resulting from the non-ejection nozzle, particularly when a plurality of inks of secondary chromatic colors are used.

(2) The image forming method as described in the item (1), wherein, in a case where the special color conversion table is set for use, another test pattern is formed, and where the identification of the non-ejection color and the line position containing the non-ejection nozzle thereof is insufficient, the special color conversion table is set again at a line adjacent to the identified line, and the setting is repeated until correct identification is obtained.

According to the image forming method, when it is determined that the identification of the non-ejection color and the line position containing the non-ejection nozzle thereof is insufficient, such a position identifying process is repeated on an as-needed basis until it is possible to correctly identify the non-ejection color and the line position containing the non-ejection nozzle thereof. Therefore, it is possible to make the unevenness less conspicuous.

The means for determining the insufficient identification is basically performed by the naked eyes, and a new line position can be identified by the comparing unit comparing present processing data with previous processing data.

(3) The image forming method as described in the item (1), wherein the special color conversion table is used for performing an approximated compensation in a color space, which is outside a color gamut of the special color conversion table, based on at least one of a combination of ink amounts providing the minimum color difference, and the amount of an ink of the same color adjacent to the non-ejection nozzle.

According to the image forming method, the special color conversion table performs approximated compensation based on at least one of a combination of ink amounts, which provides the minimum color difference, and the amount of an ink of the same color adjacent to the non-ejection nozzle. Therefore, it is possible to make the stripe unevenness resulting from the non-ejection nozzle less conspicuous.

(4) The image forming method as described in any one of the items (1) to (3), wherein the normal color conversion table and the special color conversion table are created by measuring the color of the formed the test pattern in the normal state of the ink-jet head and comparing first color space data of the test pattern with the measured color data.

According to the image forming method, it is constructed such that the normal color conversion table and the special color conversion table are set by using the test pattern. Although the normal color conversion table and the special color conversion table are generally set at the time of shipment, by such a construction, they can be reconfigured after the start of use of the image forming apparatus.

(5) According to a second aspect of the present invention, an image forming apparatus that forms an image by using first inks having secondary chromatic colors based on an input image, the apparatus including: a plurality of ink-jet heads of line type that contain the first inks; a test pattern that uses a color chart with entire colors of second inks including the first inks; a head control unit that includes: a normal color conversion table that converts a first color space of the input image into a second color space of the formed image by the ink-jet head; and a special color conversion table that converts the first color space in which one color of the second inks is omitted from the normal color conversion table into a second color space reproduces a color closest to the input image, the special color conversion table being provided with respect to each omission color; a scanner detection unit that reads a image of the test pattern formed by the ink-jet head; a comparing unit that compares the data read by the scanner detection unit with second color space data of the test pattern, and identifies a non-matching colored portion as a non-ejection color and a line position containing a non-ejection nozzle thereof; and a table setting unit that sets a special color conversion table in which the position of the non-matching colored portion and the non-ejection color identified by the comparing unit are basically employed, and transmits the set special color conversion table to the head control unit.

According to the image forming apparatus, the comparing unit identifies the non-ejection color and the line position containing the non-ejection nozzle thereof, and image formation is performed such that a special color conversion table corresponding to the non-ejection color is applied at the identified non-matching colored portion. Therefore, it is possible to optimally cope with the stripe unevenness resulting from the non-ejection nozzle, particularly when a plurality of inks of secondary chromatic colors are used.

With the construction described above, it is possible to provide an image forming method and an image forming apparatus which are suitable for an ink jet method of a line head and capable of optimally coping with stripe unevenness resulting from a non-ejection nozzle, particularly when secondary chromatic colors are used.

BRIEF DESCRIPTION OF THE DRAWINGS

The invention disclosed herein will be understood better with reference to the following drawings of which.

DETAILED DESCRIPTION OF THE INVENTION

Hereinafter, an ink jet image forming apparatus related to an image recording method according to the present invention will be described with reference to the accompanying drawings.

Figure 1:
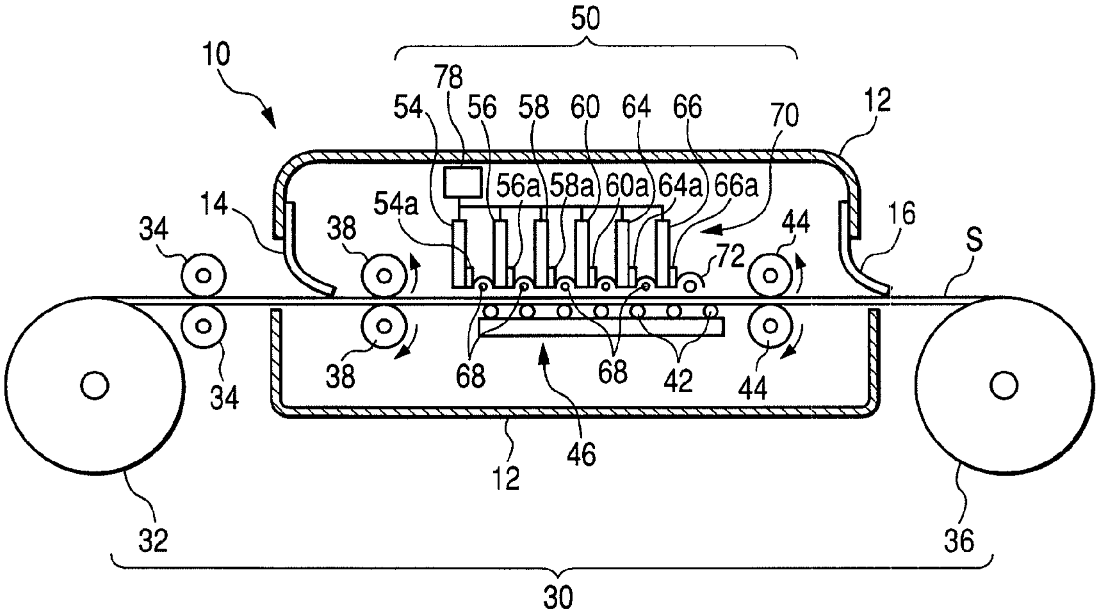
FIG. 1 is a schematic view of an active energy ray curable ink jet image forming apparatus according to an embodiment of the present invention.

FIG. 1 is a schematic view of an active energy ray curable ink jet image forming apparatus according to an embodiment of the present invention.

The active energy ray curable ink jet image forming apparatus 10 uses, as a liquid functional material of active energy ray curable type, a UV curable ink that is cured by irradiation of ultraviolet rays.

In addition, the present embodiment is directed to an image forming apparatus that uses an active energy ray curable ink; however, ink that can be used in the present invention is not limited to this, but other types of ink, generally one which can be applied to an ink jet method of a line head may be used.

As shown in FIG. 1, in a casing 12 of an active energy ray curable ink jet recording apparatus 10, a web-like recording medium S which is wound around a feed roller 32 is taken out by paired transport rollers 34, passed through a flexible, light shielding cover 14, and then transported to the inside of the casing 12. The conveyed recording medium S is conveyed out from a flexible, light shielding cover 16 disposed at an opposite side of the casing 12 and is finally wound around a winding roller 36.

The recording medium S transported to the inside of the casing 12 is held by paired, transport and holding rollers 38 and conveyed onto a plurality of support and transport rollers 42. Thereafter, the recording medium S is held by paired, transport and holding rollers 44 disposed on a downstream side of the support and transport rollers 42, where the recording medium S is subjected to scanning and transportation by the support and transport rollers 42, and is then conveyed out from the light shielding cover 16. An image recording portion 50 is disposed at a position opposed to the support and transport rollers 42 with the recording medium S disposed therebetween. In this way, a scanning and transport portion 30 is constructed by the feed roller 32, the winding roller 36, the transport rollers 34, the transport and holding rollers 38 and 44, and the support and transport rollers 42. The plurality of support and transport rollers 42 are supported by an urging means 46, and the urging means 46 is driven by a driving mechanism (not shown) so as to be movable toward and away from a head unit 70 of the image recording portion 50.

In the image recording portion 50, the head unit 70 including ink jet heads of each color; i.e., a blue ink jet head (B) 54, a cyan ink jet head (C) 56, a magenta ink jet head (M) 58, a red ink jet head (R) 60, a yellow ink jet head (Y) 64, and a black ink jet head (K) 66, and six, hot cathode tube units 68 disposed on a downstream side of a corresponding one of the ink jet heads 54, 56, 58, 60, 64, and 66, and a final curing light source 72 are arranged in the transport direction of the recording medium S from the upstream side to the downstream side.

In addition, scanners 54*a*, 56*a*, 58*a*, 60*a*, 64*a*, and 66*a* are provided on an immediately downstream side (in the illustrated state) of a corresponding one of the ink jet heads 54, 56, 58, 60, 64, and 66; however, the scanners may be provided on an immediately downstream side of a corresponding one of the six, hot cathode tube units 68 and on an immediately downstream side of the final curing light source 72. The scanners 54*a*, 56*a*, 58*a*, 60*a*, 64*a*, and 66*a* are at least formed by a line sensor having a light receiving element array of which the width is larger than an ink ejection width (image recording width) of each head. The scanners 54*a*, 56*a*, 58*a*, 60*a*, 64*a*, and 66*a* are preferably formed by photoelectric conversion elements (pixels) in which specialized filters corresponding to an ejection color of each head are arranged. In addition, the line sensor may be a black and white sensor, and instead of a line sensor, an area sensor composed of light receiving elements arranged in two-dimensional array may be used.

The scanners 54*a*, 56*a*, 58*a*, 60*a*, 64*a*, and 66*a* read a test pattern, or an actual, recorded image, recorded by a corresponding one of the ink jet heads 54, 56, 58, 60, 64, and 66 of each color to thereby detect the ejection of each head. The ejection is determined mainly by detecting the luminance of each dot. Detailed description on non-ejection determination will be provided later.

In the present invention, the number of colors of the ink jet head is not limited to seven, and it is more preferable to add more ink jet heads of light colors such as a light yellow ink jet head (LY) or a light magenta ink jet head (LM). In addition, the yellow ink jet head (Y) 64 and the black ink jet head (K) 66 may be disposed in an interchangeable manner.

In the image recording portion 50, images are recorded in an ink jet manner onto the recording medium S which is being scanned and transported on the support and transport rollers 42, and irradiation of active energy rays (in the present embodiment, ultraviolet rays) and fixing are performed on the recording medium S. In the image recording portion 50, an ink storage portion for storing ink to the ink jet heads 54, 56, 58, 60, 64, and 66 along an ink supply path (not shown) is provided in the casing 12.

In the image recording portion 50, the ink jet heads 54, 56, 58, 60, 64, and 66 of the head unit 70 at an image recording position are arranged such that respective ends of their ink ejection portions are opposed to the transport surfaces of the support and transport rollers 42. The head unit 70 is a full line head that is arranged in the width direction of the recording medium S, and a piezoelectric head is employed. Furthermore, the head unit 70 ejects an ink curable by active energy rays toward the recording medium S. In addition, the head unit 70 is connected to an ink jet head driving means 78, whereby an ejection amount of each color of ink is controlled.

The final curing light source 72 is a metal halide lamp and is disposed on the downstream side of the head unit 70.

Moreover, the hot cathode tube units 68 are paired with the ink jet heads of the head unit 70 and arranged on the downstream side by the number of inks (in the drawing, six sets are illustrated, and the hot cathode tube unit is not provided to the black ink jet head (K) 66), and are held and disposed at head holders (not shown) to thereby form the head unit 70. The image recording portion 50 is connected to an ink supply portion (not shown) for supply of ink.

Figure 2:
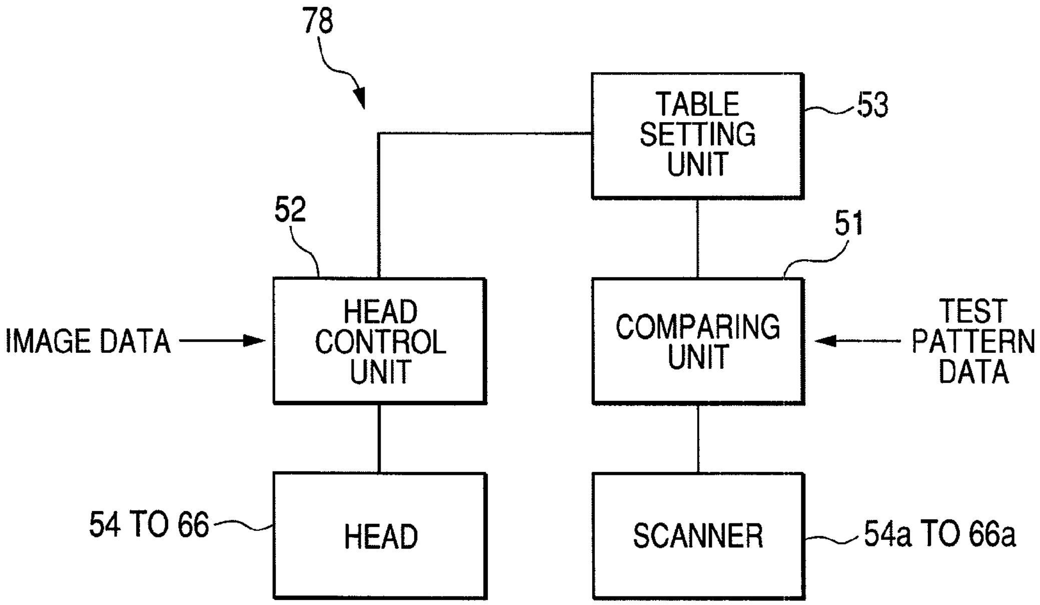
FIG. 2 is a block diagram illustrating an ink jet head driving means 78 of an ink jet recording apparatus 10.

FIG. 2 is a block diagram illustrating the ink jet head driving means 78 of the ink jet recording apparatus 10.

The ink jet head driving means 78 is provided with a head control unit 52 for controlling the ink jet heads 54, 56, 58, 60, 64, and 66. The head control unit 52 stores therein a normal color conversion table for converting a first color space of an input image into a second color space of a formed image by the ink jet heads 54, 56, 58, 60, 64, and 66, and a special color conversion table for each omission color for converting the first color space in which one color of the used ink is omitted from the normal color conversion table into a second color space which provides color reproduction closest to the input image. Detailed description on the normal color conversion table and the special color conversion table will be provided later.

The scanners 54*a*, 56*a*, 58*a*, 60*a*, 64*a*, and 66*a* are connected to a comparing unit 51 that compares data detected by the scanners 54*a*, 56*a*, 58*a*, 60*a*, 64*a*, and 66*a* with image data (actual image data or test pattern data), from which the data are originated, to thereby identify a non-matching colored portion by a non-ejection color and a line position containing a non-ejection nozzle thereof. Furthermore, the comparing unit 51 is connected to a table setting unit 53. The table setting unit 53 sets a table which is considered as being the optimal one among the normal color conversion table and the special color conversion table stored in the head control unit 52 based on the identification result of the comparing unit 51 (when the position of the non-matching colored portion and the non-ejection color are detected, a special color conversion table in which the above position and color are basically employed is identified). The table setting unit 53 is connected to the head control unit 52, and the head control unit 52 performs image recording control of the ink jet heads 54, 56, 68, 60, 64, and 66 in accordance with the image data which are input based on the set table.

Next, the normal color conversion table and the special color conversion table will be described.

In the embodiment described above, during normal image recording, the image data (first color space data) which are input to the head control unit 52 are converted by the normal color conversion table into second color space data for an ink jet printer. In this case, considering a case where ejection failure occurs in several nozzles, it is in a state where several colors of ink are not usable among the inks in use; therefore, in such a case, the special color conversion table is used which is the best conversion table capable of coping with such a state where several colors of ink are not usable.

More specifically, the present embodiment is directed to an ink jet printer that uses six colors of ink (CMYK+RB), and a method of creating a conversion table when among these colors, an ink of magenta (M) is not ejected will be described.

First, in a state in which a non-ejection nozzle is not found in the ink jet recording apparatus 10 of the present embodiment, an image of a test pattern that uses a number of color charts (second color space data) for a combination of the six colors of inks (CMYK+RB) is formed, and the color of the formed image is measured by a scanner, whereby a conversion table α for a forward direction, CMYK+RB→XYZ (CIE color system), i.e., from the second color space to the first color space. When a color M is always set to zero in the forward conversion table, i.e., M=0 at all times, another forward conversion table β, C_YK+RB→XYZ (CIE color system), is obtained in which an ink of magenta M is set to a non-ejection color.

Next, a normal color conversion table α1 for a backward direction, XYZ (CIE color system)→CMYK+RB, i.e., from the first color space to the second color space is created for the conversion table α, and similarly, a special color conversion table β1 for a backward direction, XYZ (CIE color system)->C_YK+RB, is created for the conversion table β.

Here, chromaticity coordinates which are designated in both the normal color conversion table α1 and the special color conversion table β1 are not given, without distinction, a high degree of freedom in an ink color space (in the present embodiment, a degree of freedom of from 5 to 6 is set to the chromaticity coordinates). Therefore, as a general process, a constraint condition is applied thereto so that the degree of freedom is lowered to 3, and thereafter, a combination of ink amounts is determined by using a numerical method such as a Newton-Raphson method (see, for example, "Color Engineering (2nd Edition)" by Noboru Ohta, pp. 260-264, published by Tokyo Denki University, publishing office). That is, when in the normal color conversion table α1, for example, the amount of an ink of a color K corresponding to the value of L (luminance) and the amounts of inks of colors R and B corresponding to the values of hue and saturation are predetermined as a constraint condition, it becomes possible to determine the amount of inks of the remaining colors C, M, and Y. Similarly, when in the special color conversion table β1, the amount of an ink of a color K corresponding to the value of L (luminance) and the amount of an ink of a colors B corresponding to the values of hue and saturation are predetermined as a constraint condition, it becomes possible to determine the amount of inks of the remaining colors C, Y, and R.

In this way, a special color conversion table β1 capable of coping with the state where the color M is omitted can be created. By processing a similar process on the inks of other colors, another special color conversion table β1 for each ink can be created. However, since basically, there is to be no omission color (in this example, the color M is omitted), in either of the conversion tables β and β1, an XYZ value that cannot be reproduced by any combination of ink amounts is present in the input image data (which is outside a color gamut). Therefore, for such chromaticity coordinates, a combination of ink amounts enabling approximated reproduction that can minimize a color difference (for example, ΔE) may be allocated. This approximation method will be described later following the description of an image recording process.

Next, the image recording process by the ink jet recording apparatus 10 according to the present embodiment will be described.

Figure 3:
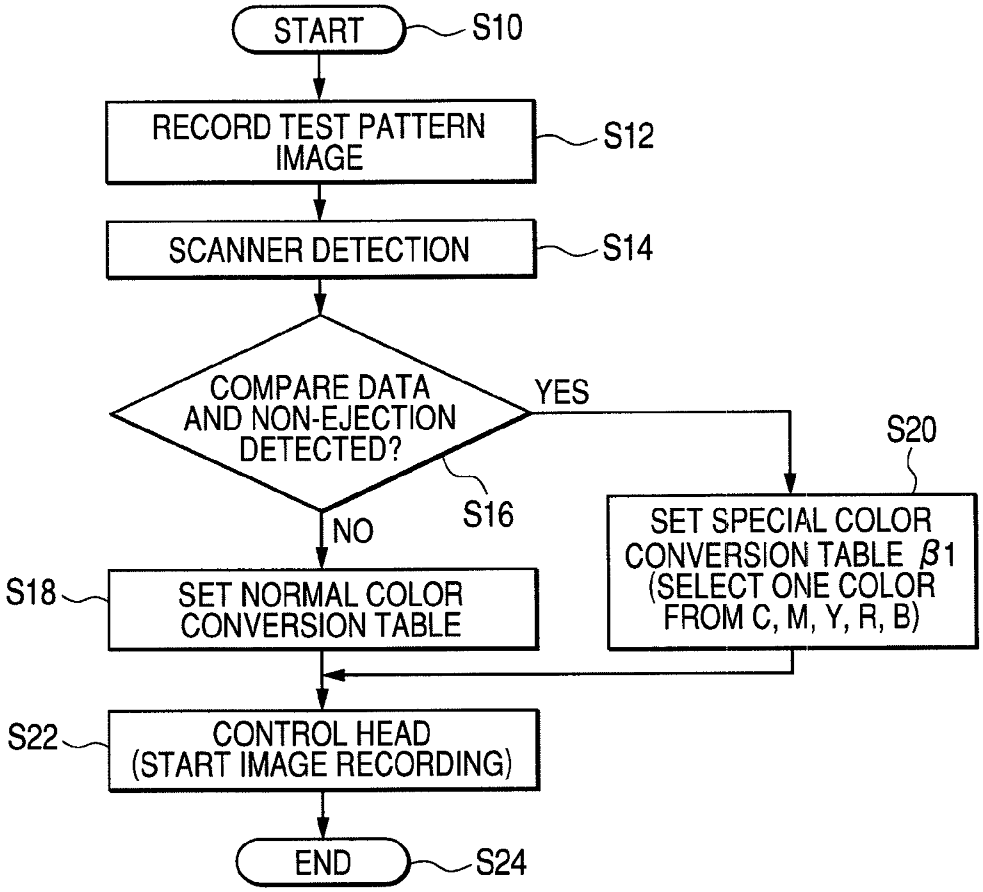
FIG. 3 is a flow chart illustrating an image recording process by the ink jet recording apparatus 10 according to the present embodiment.

FIG. 3 is a flow chart illustrating the image recording process by the ink jet recording apparatus 10 according to the present embodiment.

In step S10, an image recording process including a non-ejection inspection flow by a test pattern is started. In step S12, test pattern data which are prepared in advance are input to the head control unit 52, and the image recording process by the ink jet heads 54, 56, 58, 60, 64, and 66 is started. In step S14, the recorded test pattern images are detected by the scanners 54*a*, 56*a*, 58*a*, 60*a*, 64*a*, and 66*a* which are respectively disposed on the downstream side of a corresponding one of the ink jet heads 54, 56, 58, 60, 64, and 66. In step S16, the comparing unit 51 compares the recording image data of the test pattern detected by the scanners 54*a*, 56*a*, 58*a*, 60*a*, 64*a*, and 66*a* with the input data, and when there is a non-matching colored portion, the non-ejection color and the line position containing a non-ejection nozzle thereof are identified, and the flow proceeds to step S20. When there is not the non-matching colored portion, the flow proceeds to step S18. In step S18, the normal color conversion table α1 is set and determined by the table setting unit 53. In step S22, since the normal color conversion table α1 has been set in step S18, the head control unit 51 performs a subsequent image recording process by using the normal color conversion table α1.

On the other hand, when it is determined in step S16 that there is the non-matching colored portion in which the recording image data of the test pattern detected by the scanners 54*a*, 56*a*, 58*a*, 60*a*, 64*a*, and 66*a* do not match the input data, the flow proceeds to step S20. In step S20, the table setting unit 53 selects a special color conversion table β1 for one of the colors C, M, Y, R, and B, based on the identification of the non-ejection color of the non-matching colored portion and the line position containing the non-ejection nozzle thereof to thereby transmits the selected, special color conversion table β1 to the head control unit 51 so that the process to an ejection line at a position corresponding to the non-ejection nozzle is performed based on the selected, special color conversion table β1. In step S22, based on the input from the table setting unit 53, the head control unit 51 performs the subsequent image recording process such that the process to the ejection line at a position corresponding to the non-ejection nozzle is performed based on the special color conversion table β1 while the process to other ejection lines is performed based on the normal color conversion table α1.

As an example of the non-ejection detection method of the comparing unit 51 by the test pattern in step S16, a process is performed as follows.

Assuming n being a positive integer of 2 or more, when recording dots with a diameter n times the minimum dot pitch in a direction substantially perpendicular to the transport direction of the recording medium having the test pattern recorded thereon, each of the ink jet heads 54, 56, 58, 60, 64, and 66 records the test pattern image such that during ejection wherein one row of dots are formed in a direction substantially perpendicular to the recording medium transport direction, the ejection is performed at an interval of (n−1) nozzle and that while switching the ejection nozzles, n rows of dots are formed at a pitch n times the minimum dot pitch in the recording medium transport direction.

With such a method, when n is a positive integer, dots are ejected at an interval of (n−1) nozzle in a row of dots extending in the direction substantially perpendicular to the recording medium transport direction, and in this manner, n rows of dots are ejected. By doing this, the entire nozzles can perform ejection such that adjacent dots do not overlap with each other, whereby it is possible to suppress reading errors.

Here, as described above, although the special color conversion table β1 for each non-ejection ink is prepared in advance, since basically, there is to be no omission color (in this example, the color M is omitted), in either of the conversion tables β and β1, an XYZ value that cannot be reproduced by any combination of ink amounts is present in the input image data (which is outside a color gamut). Therefore, for such chromaticity coordinates, a combination of ink amounts enabling approximated reproduction that can minimize a color difference (for example, ΔE) may be allocated in the table setting unit 53.

According to an example of this approximation method, in the table setting unit 53, when the resolution of an actual color obtainable when the special color conversion table β1 obtained in the above-described manner is employed exceeds a predefined value, the XYZ value is determined as being outside a color reproduction range, and a color obtained by moving the obtained color toward substantially the center of the color reproduction range of a printer is used as an approximated color of the original color. This process is repeated until the predefined resolution is obtained. Detailed description on this process will be provided later.

Figure 4:
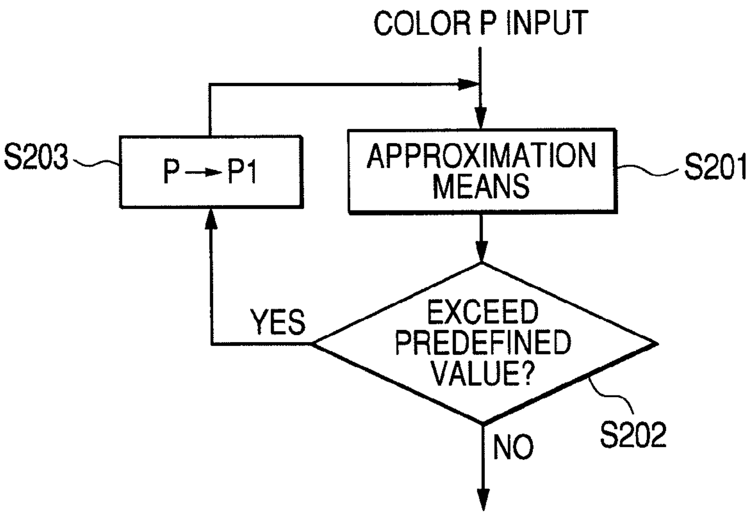
FIG. 4 is a flow chart illustrating a partial process of a table setting unit 53.

FIG. 4 is a flow chart illustrating a partial process of the table setting unit 53. As shown in FIG. 4, assuming that a point at which the image data is present is defined by a color P, in step S201 by the table setting unit 53, in determining whether or not the XYZ value is outside the color reproduction range, an approximated value is calculated by an approximation means based on the above-described Newton-Raphson method. Next, in step S202, whether the calculated approximated value exceeds a predefined resolution value, which indicates that the calculated approximated value is outside the color reproduction range, is determined by a determining means. When the calculated approximated value is smaller than the predefined resolution value, the process is performed base on the special color conversion table β1. On the other hand, when the calculated approximated value exceeds the predefined resolution value, in step S203, the color P is substituted by color P1 by moving the color P by a predetermined value toward substantially the center of the color reproduction range of a printer, and the flow returns to step S201, where an approximated value is calculated again by the approximation means. This process is repeated until the calculated approximated value falls within the color reproduction range. Here, the predetermined value used in the substitution of P→P1 such that the previous color P is moved toward substantially the center of the color reproduction range of a printer corresponds to a color difference obtained by multiplying the resolution ΔE of the approximation by a coefficient r ($0<r<1$).

Figure 5:
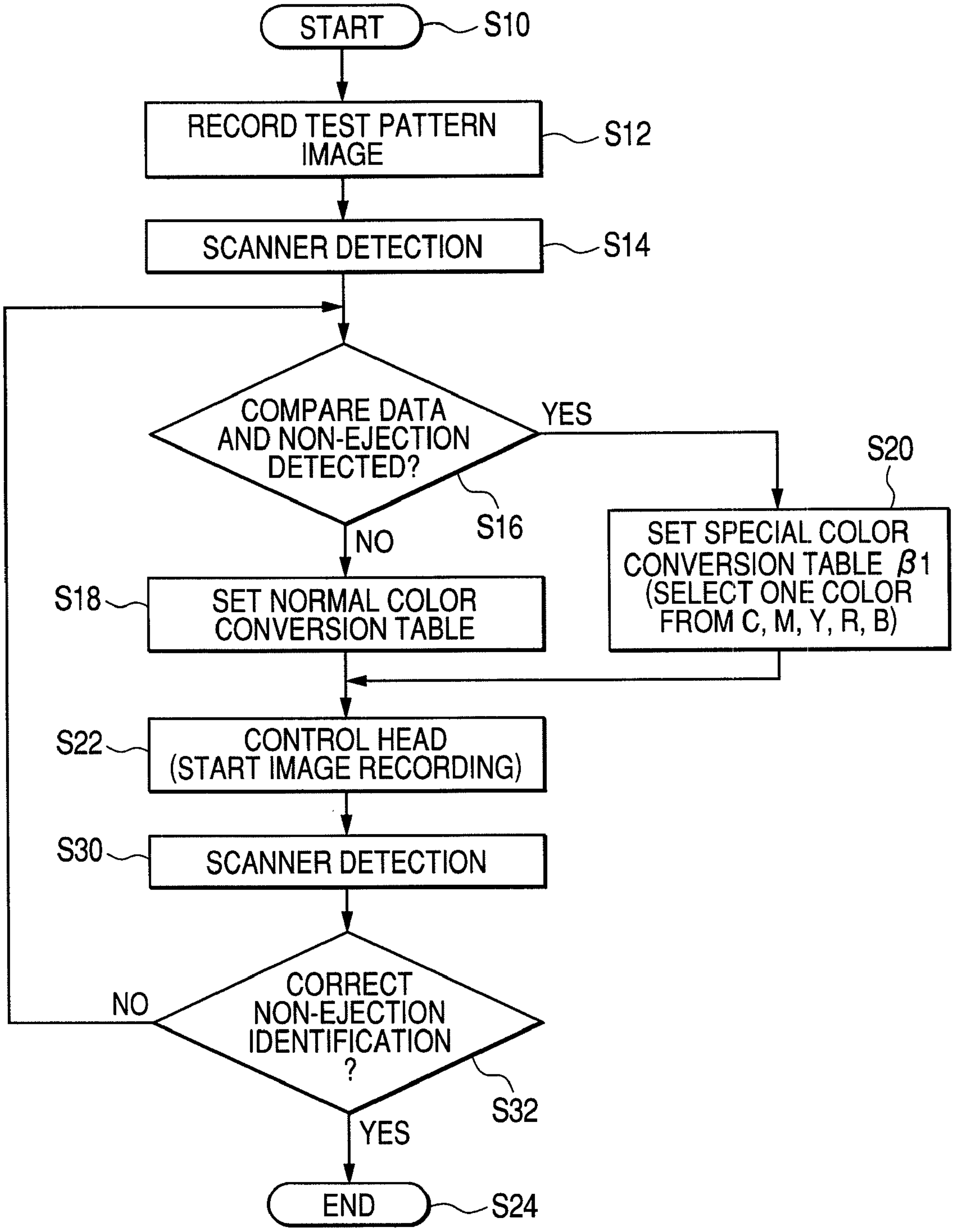
FIG. 5 is a flow chart illustrating another example of the image recording process by the ink jet recording apparatus 10 according to the present embodiment.

FIG. 5 is a flow chart illustrating another example of the image recording process by the ink jet recording apparatus 10 according to the present embodiment.

The steps S10 to S22 are the same as those of the flow chart of FIG. 3, and thus description thereof will be omitted.

When unexpected defects are found by the naked eyes on the image formed by the image recording process of the head control unit 51 in step S22, the detection step by the scanners 54*a*, 56*a*, 58*a*, 60*a*, 64*a*, and 66*a* is performed again in step S30. Thereafter, in step S32, the detection results in step S30 are compared with the detection results in steps S14, and when they do not match, the test pattern image recording in step S12 or the scanner detection in step S14 is performed.

In the present embodiment, although the active energy ray curable ink jet image forming apparatus 10 is constructed to form images on a web-like recording medium with a, fixed line head; however, a sheet-like recording medium may be used The "active energy" as used in the present invention is not particularly limited as long as its irradiation can impart energy capable of generating an initiation species in the ink composition, and widely includes α-ray, γ-ray, X-ray, ultraviolet ray, visible ray, electron beam and the like. Among these, in view of curing sensitivity and easy availability of the apparatus, ultraviolet ray and electron beam are preferred, and ultraviolet ray is more preferred. Accordingly, the ink composition for use in the present invention is preferably an ink composition which can be cured by the irradiation of ultraviolet ray.

In the inkjet recording apparatus of the present invention, the peak wavelength of active energy varies depending on the absorption characteristics of the sensitizing dye in the ink composition but is suitably, for example, from 200 to 600 nm, preferably from 300 to 450 nm, more preferably from 350 to 450 nm. Also, the (a) electron transfer-type initiation system of the ink composition for use in the present invention exhibits sufficiently high sensitivity even for low-output active energy. Accordingly, the output of the active energy used as the irradiation energy is suitably, for example, 2,000 $mJ/cm^2$ or less, preferably from 10 to 2,000 $mJ/cm^2$, more preferably from 20 to 1,000 $mJ/cm^2$, still more preferably from 50 to 800 $mJ/cm^2$. Also, the active energy is suitably irradiated at an exposure surface illuminance (a maximum illuminance on the recording medium surface) of, for example, from 10 to 2,000 $mW/cm^2$, preferably from 20 to 1,000 $mW/cm^2$.

Particularly, in the inkjet recording apparatus of the present invention, the active energy is preferably irradiated from a light-emitting diode which can generate an ultraviolet ray having an emission wavelength peak of 390 to 420 nm and giving a maximum illuminance of 10 to 1,000 $mW/cm^2$ on the recording medium surface.

Also, in the inkjet recording apparatus of the present invention, the active energy suitably irradiates the ink composition ejected on a recording medium, for example, for 0.01 to 120 seconds, preferably from 0.1 to 90 seconds.

Furthermore, in the inkjet recording apparatus of the present invention, it is preferred that the ink composition is heated to a fixed temperature and the time from the landing of ink composition on a recording medium to the irradiation of active energy is set to 0.01 to 0.5 seconds, preferably from 0.02 to 0.3 seconds, more preferably from 0.03 to 0.15 seconds. By virtue of controlling the time from the landing of ink composition on a recording medium to the irradiation of active energy to such a very short time, the ink composition landed can be prevented from bleeding before curing.

For obtaining a color image by using the inkjet recording apparatus of the present invention, the colors are preferably superposed in the color value order from lower to higher. When superposed in such an order, the active energy can readily reach the ink in the lower part and this can be expected to yield good curing sensitivity, reduction of residual monomer, decrease of odor and enhancement of adhesive property. As for the irradiation of active energy, all colors may be ejected and en bloc exposed, but exposure is preferably performed every each color in view of accelerating the curing.

As described above, in the case of active energy-curable ink like the ink composition of the present invention, the ink composition ejected is preferably kept at a constant temperature and therefore, the temperature in the region from the ink supply tank to the inkjet head portion is preferably controlled by heat insulation and heating. Also, the head unit is preferably heated by thermally shielding or insulating the apparatus body so as not to receive an effect from the temperature of outer air. In order to shorten the printer start-up time necessary for heating or reduce the loss of heat energy, in combination with thermal insulation from other sites, the heat capacity of the entire heating unit is preferably made small.

As for the active energy source, a mercury lamp, a gas/solid laser and the like are principally utilized and for the ultraviolet curing-type inkjet, a mercury lamp and a metal halide lamp are widely known. Furthermore, replacement by a GaN-based semiconductor ultraviolet light-emitting device is industrially and environmentally very useful. In addition, LED (UV-LED) and LD (UV-LD) are compact, long-lived, highly efficient and low costing and are promising as a radiation source for active energy curing-type inkjet.

As described above, a light-emitting diode (LED) and a laser diode (LD) can be used as the active energy source. In particular, when an ultraviolet source is necessary, an ultraviolet LED or an ultraviolet LD can be used. For example, an ultraviolet LED of which main emission spectrum has a wavelength between 365 nm and 420 nm is commercially available from Nichia Corp. Also, when a further shorter wavelength is required, an LED capable of emitting active energy having a primary emission between 300 nm and 370 nm is disclosed in U.S. Pat. No. 6,084,250. Other ultraviolet LEDs are also available, and radiations in different ultraviolet bands may be irradiated. The active energy source for use in the present invention is preferably UV-LED, more preferably UV-LED having a peak wavelength in the region of 350 to 420 nm.

(Recording Medium)

The recording medium to which the ink composition of the present invention can be applied is not particularly limited and normal paper sheets such as non-coated paper and coated paper, and various non-absorptive resin materials and resin films shaped therefrom, which are used in so-called soft packaging, may be used. Examples of various plastic films include PET film, OPS film, OPP film, ONy film, PVC film, PE film and TAC film. Other examples of the plastic usable as the recording medium material include polycarbonate, acrylic resin, ABS, polyacetal, PVA and rubbers. Furthermore, metals and glasses may also be used as the recording medium.

In the ink composition of the present invention, when a material less causing heat shrinkage at curing is selected, excellent adhesive property is obtained between the cured ink composition and the recording medium and this is advantageous in that a high-definition image can be formed even on a film susceptible to curling or deformation due to, for example, curing shrinkage of ink or heat generation at the curing reaction, such as PET film, OPS film, OPP film, ONy film and PVC film which are thermally shrinkable.

The constituent components for use in the ink composition usable in the present invention are described below in sequence.

(Ink Composition)

The ink composition for use in the present invention is an ink composition capable of being cured by the irradiation of active energy, and examples thereof include a cationic polymerization-type ink composition, a radical polymerization-type ink composition and an aqueous ink composition. These compositions are described in detail below.

(Cationic Polymerization-Type Ink Composition)

The cationic polymerization-type ink composition contains (a) a cationic polymerizable compound and (b) a compound capable of generating an acid upon irradiation with active energy and if desired, may further contain a colorant, an ultraviolet absorbent, a sensitizer, an antioxidant, a discoloration inhibitor, electrically conducting salts, a solvent, a polymer compound, a surfactant and the like.

The constituent components used in the cationic polymerization-type ink composition are described below in sequence.

((a) Cationic Polymerizable Compound)

The (a) cationic polymerizable compound for use in the present invention is not particularly limited as long as it is a compound capable of being cured by causing a polymerization reaction using an acid generated from the (b) compound capable of generating an acid upon irradiation with active energy, and various known cationic polymerizable monomers known as a photo-cationic polymerizable monomer may be used. Examples of the cationic polymerizable monomer include epoxy compounds, vinyl ether compounds and oxetane compounds described in JP-A-6-9714, JP-A-2001-31892, JP-A-2001-40068, JP-A-2001-55507, JP-A-2001-310938, JP-A-2001-310937 and JP-A-2001-220526.

Examples of the epoxy compound include an aromatic epoxide, an alicyclic epoxide and an aliphatic epoxide.

The aromatic epoxide includes a di- or polyglycidyl ether produced by the reaction of a polyhydric phenol having at least one aromatic nucleus or an alkylene oxide adduct thereof with epichlorohydrin. Examples thereof include a di- or polyglycidyl ether of bisphenol A or an alkylene oxide adduct thereof, a di- or polyglycidyl ether of hydrogenated bisphenol A or an alkylene oxide adduct thereof, and a novolak-type epoxy resin. Examples of the alkylene oxide include an ethylene oxide and a propylene oxide.

As for the alicyclic epoxide, a cyclohexene oxide- or cyclopentene oxide-containing compound obtained by epoxidizing a compound having at least one cycloalkene ring such as cyclohexene or cyclopentene ring with an appropriate oxidizing agent such as hydrogen peroxide and peracid is preferred.

Examples of the aliphatic epoxide include a di- or polyglycidyl ether of an aliphatic polyhydric alcohol or an alkylene oxide adduct thereof. Representative examples thereof include a diglycidyl ether of an alkylene glycol, such as diglycidyl ether of ethylene glycol, diglycidyl ether of propylene glycol, and diglycidyl ether of 1,6-hexanediol; a polyglycidyl ether of a polyhydric alcohol, such as di- or triglycidyl ether of glycerin or an alkylene oxide adduct thereof; and a diglycidyl ether of a polyalkylene glycol, as represented by a diglycidyl ether of a polyethylene glycol or an alkylene oxide adduct thereof, and a diglycidyl ether of a polypropylene glycol or an alkylene oxide adduct thereof. Here, examples of the alkylene oxide include an ethylene oxide and a propylene oxide.

The epoxy compound may be monofunctional or polyfunctional.

Examples of the monofunctional epoxy compound which can be used in the present invention include phenyl glycidyl ether, p-tert-butylphenyl glycidyl ether, butyl glycidyl ether, 2-ethylhexyl glycidyl ether, allyl glycidyl ether, 1,2-butylene oxide, 1,3-butadiene monoxide, 1,2-epoxydodecane, epichlorohydrin, 1,2-epoxydecane, styrene oxide, cyclohexene oxide, 3-methacryloyloxymethylcyclohexene oxide, 3-acryloyloxymethylcyclohexene oxide and 3-vinylcyclohexene oxide.

Examples of the polyfunctional epoxy compound include bisphenol A diglycidyl ether, bisphenol F diglycidyl ether, bisphenol S diglycidyl ether, brominated bisphenol A diglycidyl ether, brominated bisphenol F diglycidyl ether, brominated bisphenol S diglycidyl ether, epoxy novolak resin, hydrogenated bisphenol A diglycidyl ether, hydrogenated bisphenol F diglycidyl ether, hydrogenated bisphenol S diglycidyl ether, 3,4-epoxycyclohexylmethyl-3',4'-epoxycyclohexane carboxylate, 2-(3,4-epoxycyclohexyl-5,5-spiro-3,4-epoxy)cyclohexane-meta-dioxane, bis(3,4-epoxycyclohexylmethyl)adipate, vinylcyclohexene oxide, 4-vinylepoxycyclohexane, bis(3,4-epoxy-6-methylcyclohexylmethyl)adipate, 3,4-epoxy-6-methylcyclohexyl-3',4'-epoxy-6'-methylcyclohexane carboxylate, methylenebis(3,4-epoxycyclohexane), dicyclopentadiene diepoxide, di(3,4-epoxycyclohexylmethyl)ether of ethylene glycol, ethylenebis(3,4-epoxycyclohexane carboxylate), dioctyl epoxyhexahydrophthalate, di-2-ethylhexyl epoxyhexahydrophthalate, 1,4-butanediol diglycidyl ether, 1,6-hexanediol diglycidyl ether, glycerin triglycidyl ether, trimethylolpropane triglycidyl ether, polyethylene glycol diglycidyl ether, polypropylene glycol diglycidyl ethers, 1,1,3-tetradecadiene dioxide, limonene dioxide, 1,2,7,8-diepoxyoctane and 1,2,5,6-diepoxycyclooctane.

Among these epoxy compounds, an aromatic epoxide and an alicyclic epoxide are preferred in view of excellent curing rate, and an alicyclic epoxide is more preferred.

Examples of the vinyl ether compound include a di- or trivinyl ether compound such as ethylene glycol divinyl ether, diethylene glycol divinyl ether, triethylene glycol divinyl ether, propylene glycol divinyl ether, dipropylene glycol divinyl ether, butanediol divinyl ether, hexanediol divinyl ether, cyclohexanedimethanol divinyl ether and trimethylolpropane trivinyl ether; and a monovinyl ether compound such as ethyl vinyl ether, n-butyl vinyl ether, isobutyl vinyl ether, octadecyl vinyl ether, cyclohexyl vinyl ether, hydroxybutyl vinyl ether, 2-ethylhexyl vinyl ether, cyclohexanedimethanol monovinyl ether, n-propyl vinyl ether, isopropyl vinyl ether, isopropenyl ether-O-propylene carbonate, dodecyl vinyl ether, diethylene glycol monovinyl ether and octadecyl vinyl ether.

The vinyl ether compound may be monofunctional or polyfunctional.

Specifically, examples of the monofunctional vinyl ether include methyl vinyl ether, ethyl vinyl ether, propyl vinyl ether, n-butyl vinyl ether, tert-butyl vinyl ether; 2-ethylhexyl vinyl ether, n-nonyl vinyl ether, lauryl vinyl ether, cyclohexyl vinyl ether, cyclohexylmethyl vinyl ether, 4-methylcyclohexylmethyl vinyl ether, benzyl vinyl ether, dicyclopentenyl vinyl ether, 2-dicyclopentenoxyethyl vinyl ether, methoxyethyl vinyl ether, ethoxyethyl vinyl ether, butoxyethyl vinyl ether, methoxyethoxyethyl vinyl ether, ethoxyethoxyethyl vinyl ether, methoxypolyethylene glycol vinyl ether, tetrahydrofurfuryl vinyl ether, 2-hydroxyethyl vinyl ether, 2-hydroxypropyl vinyl ether, 4-hydroxybutyl vinyl ether, 4-hydroxymethylcyclohexylmethyl vinyl ether, diethylene glycol monovinyl ether, polyethylene glycol vinyl ether, chloroethyl vinyl ether, chlorobutyl vinyl ether, chloroethoxyethyl vinyl ether, phenylethyl vinyl ether and phenoxypolyethylene glycol vinyl ether.

Examples of the polyfunctional vinyl ether include divinyl ethers such as ethylene glycol divinyl ether, diethylene glycol divinyl ether, polyethylene glycol divinyl ether, propylene glycol divinyl ether, butylene glycol divinyl ether, hexanediol divinyl ether, bisphenol A alkylene oxide divinyl ether and bisphenol F alkylene oxide divinyl ether; and polyfunctional vinyl ethers such as trimethylolethane trivinyl ether, trimethylolpropane trivinyl ether, ditrimethylolpropane tetravinyl ether, glycerin trivinyl ether, pentaerythritol tetravinyl ether, dipentaerythritol pentavinyl ether, dipentaerythritol hexavinyl ether, ethylene oxide-added trimethylolpropane trivinyl ether, propylene oxide-added trimethylolpropane trivinyl ether, ethylene oxide-added ditrimethylolpropane tetravinyl ether, propylene oxide-added ditrimethylolpropane tetravinyl ether, ethylene oxide-added pentaerythritol tetravinyl ether, propylene oxide-added pentaerythritol tetravinyl ether, ethylene oxide-added dipentaerythritol hexavinyl ether and propylene oxide-added dipentaerythritol hexavinyl ether.

As for the vinyl ether compound, a di- or trivinyl ether compound is preferred in view of curing property, adhesion to recording medium, surface hardness of image formed, or the like, and a divinyl ether compound is more preferred.

The oxetane compound as referred to in the present invention indicates a compound having an oxetane ring, and known oxetane compounds described, for example, in JP-A-2001-220526, JP-A-2001-310937 and JP-A-2003-341217 may be arbitrarily selected and used.

The compound having an oxetane ring, which can be used in the ink composition of the present invention, is preferably a compound having from one to four oxetane rings in the structure thereof. When such a compound is used, the viscosity of the ink composition can be easily maintained in the range allowing for good handling, and high adhesion can be obtained between the ink composition after curing and the recording medium.

Such a compound having an oxetane ring is described in detail in paragraphs [0021] to [0084] of JP-A-2003-341217, and compounds described therein can be suitably used also in the present invention.

Out of the oxetane compounds for use in the present invention, a compound having one oxetane ring is preferably used in view of viscosity and tackiness of the ink composition.

In the ink composition of the present invention, one of these cationic polymerizable compounds may be used alone, or two or more species thereof may be used in combination, but from the standpoint of effectively controlling the shrinkage on curing the ink, at least one compound selected from oxetane compounds and epoxy compounds is preferably used in combination with a vinyl ether compound.

The content of the (a) cationic polymerizable compound in the ink composition is suitably from 10 to 95 mass %, preferably from 30 to 90 mass %, more preferably from 50 to 85 mass %, based on the entire solid content of the composition.

((b) Compound Capable of Generating an Acid Upon Irradiation with Active Energy)

The ink composition of the present invention contains a compound capable of generating an acid upon irradiation with active energy (hereinafter appropriately referred to as a "photoacid generator").

The photoacid generator which can be used in the present invention may be appropriately selected from compounds capable of generating an acid upon irradiation with light (ultraviolet ray or far ultraviolet ray of 400 to 200 nm, preferably g-ray, h-ray, i-ray or KrF excimer laser light), ArF excimer laser light, electron beam, X-ray, molecular beam or ion beam, which are used in a photo-cationic polymerization photoinitiator, a photo-radical polymerization photoinitiator, a photo-decolorizing agent for coloring matters, a photo-discoloring agent, a micro resist or the like.

Examples of such a photoacid generator include an onium salt which decomposes upon irradiation with active energy to generate an acid, such as diazonium salt, ammonium salt, phosphonium salt, iodonium salt, sulfonium salt, selenonium salt and arsonium salt; an organic halogen compound; an organic metal/organic halide; an o-nitrobenzyl type protective group-containing photoacid generator; a compound capable of undergoing photodecomposition to generate a sulfonic acid, as represented by imino sulfonate; a disulfone compound; a diazoketosulfone; and a diazodisulfone compound.

Furthermore, for example, oxazole derivatives and s-triazine derivatives described in paragraphs [0029] to [0030] of JP-A-2002-122994 may also be suitably used as the photoacid generator. In addition, onium salt compounds and sulfonate-based compounds described in paragraphs [0037] to [0063] of JP-A-2002-122994 may also be suitably used as the photoacid generator in the present invention.

As for the (b) photoacid generator, one species may be used alone or two or more species may be used in combination.

The content of the (b) photoacid generator in the ink composition is preferably from 0.1 to 20 mass %, more preferably from 0.5 to 10 mass %, still more preferably from 1 to 7 mass %, based on the entire solid content of the ink composition.

(Colorant)

The ink composition of the present invention can form a visible image by adding thereto a colorant. For example, in the case of forming an image region of a lithographic printing plate, a colorant need not be necessarily added, but in view of suitability for plate inspection of the obtained lithographic printing plate, use of a colorant is also preferred.

The colorant which can be used here is not particularly limited, and various known coloring materials (pigment, dye) may be appropriately selected and used according to the usage. For example, in the case of forming an image with excellent weather resistance, a pigment is preferred. As for the dye, both a water-soluble dye and an oil-soluble dye may be used, but an oil-soluble dye is preferred.

(Pigment)

The pigment which is preferably used in the present invention is described below.

The pigment is not particularly limited and, for example, all organic and inorganic pigments generally available on the market, those obtained by dispersing a pigment in a dispersion medium such as insoluble resin, and those obtained by grafting a resin to the pigment surface may be used. In addition, those obtained by, for example, dyeing a resin particle with a dye may also be used.

Examples of such a pigment include pigments described in Seishiro Ito (compiler), *Ganryo No Jiten* (*Pigment Dictionary*), published in 2000, W. Herbst and K. Hunger, *Industrial Organic Pigments*, JP-A-2002-12607, JP-A-2002-188025, JP-A-2003-26978 and JP-A-2003-342503.

Specific examples of the organic and inorganic pigments which can be used in the present invention are as follows. Examples of the pigment which provides a yellow color include a monoazo pigment such as C.I. Pigment Yellow 1 (e.g., Fast Yellow G) and C.I. Pigment Yellow 74; a disazo pigment such as C.I. Pigment Yellow 12 (e.g., Disazo Yellow AAA) and C.I. Pigment Yellow 17; a non-benzidine-based azo pigment such as C.I. Pigment Yellow 180; an azo lake pigment such as C.I. Pigment Yellow 100 (e.g., Tartrazine Yellow Lake): a condensed azo pigment such as C.I. Pigment Yellow 95 (e.g., Condensed Azo Yellow GR); an acidic dye lake pigment such as C.I. Pigment Yellow 115 (e.g., Quinoline Yellow Lake); a basic dye lake pigment such as C.I. Pigment Yellow 18 (e.g., Thioflavine Lake); an anthraquinone-based pigment such as Flavanthrone Yellow (Y-24); an isoindolinone pigment such as Isoindolinone Yellow 3RLT (Y-110); a quinophthalone pigment such as Quinophthalone Yellow (Y-138); an isoindoline pigment such as Isoindoline Yellow (Y-139); a nitroso pigment such as C.I. Pigment Yellow 153 (e.g., Nickel Nitroso Yellow); and a metal complex salt azomethine pigment such as C.I. Pigment Yellow 117 (e.g., Copper Azomethine Yellow).

Examples of the pigment which provides a red or magenta color include a monoazo-based pigment such as C.I. Pigment Red 3 (e.g., Toluidine Red); a disazo pigment such as C.I. Pigment Red 38 (e.g., Pyrazolone Red B); an azo lake pigment such as C.I. Pigment Red 53:1 (e.g., Lake Red C) and C.I. Pigment Red 57:1 (Brilliant Carmine 6B); a condensed azo pigment such as C.I. Pigment Red 144 (e.g., Condensed Azo Red BR); an acidic dye lake pigment such as C.I. Pigment Red 174 (e.g., Phloxine B Lake); a basic dye lake pigment such as C.I. Pigment Red 81 (e.g., Rhodamine 6G' Lake); an anthraquinone-based pigment such as C.I. Pigment Red 177 (e.g., Dianthraquinonyl Red); a thioindigo pigment such as C.I. Pigment Red 88 (e.g., Thioindigo Bordeaux); a perinone pigment such as C.I. Pigment Red 194 (e.g., Perinone Red); a perylene pigment such as C.I. Pigment Red 149 (e.g., Perylene Scarlet); a quinacridone pigment such as C.I. Pigment Violet 19 (unsubstituted quinacridone) and C.I. Pigment Red 122 (e.g., Quinacridone Magenta); an isoindolinone pigment such as C.I. Pigment Red 180 (e.g., Isoindolinone Red 2BLT); and an alizarin lake pigment such as C.I. Pigment Red 83 (e.g., Madder Lake).

Examples of the pigment which provides a blue or cyan color include a disazo-based pigment such as C.I. Pigment Blue 25 (e.g., Dianisidine Blue); a phthalocyanine pigment such as C.I. Pigment Blue 15 (e.g., Phthalocyanine Blue); an acidic dye lake pigment such as C.I. Pigment Blue 24 (e.g., Peacock Blue Lake); a basic dye lake pigment such as C.I. Pigment Blue 1 (e.g., Victoria Pure Blue BO Lake); an anthraquinone-based pigment such as C.I. Pigment Blue 60 (e.g., Indanthrone Blue); and an alkali blue pigment such as C.I. Pigment Blue 18 (Alkali Blue V-5:1).

Examples of the pigment which provides a green color include a phthalocyanine pigment such as C.I. Pigment Green 7 (Phthalocyanine Green) and C.I. Pigment Green 36 (Phthalocyanine Green); and an azo metal complex pigment such as C.I. Pigment Green 8 (Nitroso Green).

Examples of the pigment which provides an orange color include an isoindoline-based pigment such as C.I. Pigment Orange 66 (Isoindoline Orange); and an anthraquinone-based pigment such as C. I. Pigment Orange 51 (Dichloropyranthrone Orange).

Examples of the pigment which provides a black color include carbon black, titanium black and aniline black.

Specific examples of the white pigment which can be used include basic lead carbonate ($2PbCO_3Pb(OH)_2$, so-called "silver white"), zinc oxide (ZnO, so-called "zinc white"), titanium oxide ($TiO_2$, so-called "titanium white"), strontium titanate ($SrTiO_3$, so-called "titanium strontium white").

Here, titanium oxide has a low specific gravity and a high refractive index and is chemically and physically stable as compared with other white pigments and therefore, this pigment ensures that the masking power and coloring power as a pigment are high and the durability against acid, alkali and other environments is excellent. Because of this, titanium oxide is preferably used as the white pigment. As a matter of course, other white pigments (may also be a white pigment other than those described above) may be used, if desired.

The pigment may be dispersed by using a dispersing device such as ball mill, sand mill, attritor, roll mill, jet mill, homogenizer, paint shaker, kneader, agitator, Henschel mixer, colloid mill, ultrasonic homogenizer, pearl mill and wet jet mill.

When dispersing the pigment, a dispersant may also be added. Examples of the dispersant include a hydroxyl group-containing carboxylic acid ester, a salt of long-chain polyaminoamide with high molecular weight acid ester, a salt of high molecular weight polycarboxylic acid, a high molecular weight unsaturated acid ester, a polymer copolymerization product, a modified polyacrylate, an aliphatic polyvalent carboxylic acid, a naphthalenesulfonic acid formalin condensate, a polyoxyethylene alkylphosphoric ester and a pigment derivative. A commercially available polymer dispersant such as Solsperse Series of Zeneca Ltd. may also be preferably used.

In addition, a synergist according to various pigments may be used as a dispersion aid. The dispersant or dispersion aid is preferably added in an amount of 1 to 50 parts by mass per 100 parts by mass of the pigment.

In the ink composition, a solvent may be added as a dispersion medium for various components such as pigment, or the (a) cationic polymerizable compound which is a low molecular weight component may be used as a dispersion medium without using a solvent. However, since the ink composition of the present invention is an active energy-curable ink and the ink is applied onto a recording medium and then cured, the ink composition is preferably solvent-free. This is because when a solvent remains in the cured ink image, the solvent resistance may deteriorate or the residual solvent may cause a problem of VOC (volatile organic compound). From such a standpoint, the (a) cationic polymerizable compound is preferably used as the dispersion medium. Above all, in view of dispersion suitability or enhancement of handling property of the ink composition, a cationic polymerizable monomer having a lowest viscosity is preferably selected.

The average particle diameter of the pigment is preferably from 0.02 to 4 μm, more preferably from 0.02 to 2 μm, still more preferably from 0.02 to 1.0 μm.

The pigment, dispersant, dispersion medium and dispersion or filtration conditions are selected or set so that the pigment particle can have an average particle diameter in the above-described preferred range. By this control of the particle diameter, clogging of the head nozzle can be suppressed and the storage stability, transparency and curing sensitivity of ink can be maintained.

(Dye)

The dye for use in the present invention is preferably an oil-soluble dye. Specifically, the oil-soluble dye means a dye having a solubility in water at 25° C. (mass of the coloring matter dissolved in 100 g of water) of 1 g or less. The solubility is preferably 0.5 g or less, more preferably 0.1 g or less. Accordingly, a so-called water-insoluble oil-soluble dye is preferably used.

As regards the dye for use in the present invention, it is also preferred to introduce an oil-solubilizing group into the mother nucleus of the above-described dye for the purpose of dissolving a necessary amount of dye in the ink composition.

Examples of the oil-solubilizing group include a long-chain or branched alkyl group, a long-chain or branched alkoxy group, a long-chain or branched alkylthio group, a long-chain or branched alkylsulfonyl group, a long-chain or branched acyloxy group, a long-chain or branched alkoxycarbonyl group, a long-chain or branched acyl group, a long-chain or branched acylamino group, a long-chain or branched alkylsulfonylamino group, a long-chain or branched alkylaminosulfonyl group; and an aryl group, an aryloxy group, an aryloxycarbonyl group, an arylcarbonyloxy group, an arylaminocarbonyl group, an arylaminosulfonyl group and an arylsulfonylamino group, each containing the above-described long-chain or branched substituent.

Furthermore, the dye may be obtained from a water-soluble dye having a carboxyl acid or a sulfonic acid through conversion into an oil-solubilizing group, that is, an alkoxycarbonyl group, an aryloxycarbonyl group, an alkylaminosulfonyl group or an arylaminosulfonyl group, by using a long-chain or branched alcohol, an amine, a phenol or an aniline derivative.

The oil-soluble dye preferably has a melting point of 200° C. or less, more preferably 150° C. or less, still more preferably 100° C. By using an oil-soluble dye having a low melting point, crystal precipitation of the coloring matter in the ink composition is suppressed and the ink composition comes to have good storage stability.

Furthermore, for the purpose of improving resistance against fading, particularly against an oxidative substance such as ozone, or enhancing the curing property, the oxidation potential is preferably noble (high). For this reason, the oil-soluble dye for use in the present invention preferably has an oxidation potential of 1.0 V (vs SCE) or more. A higher oxidation potential is preferred, and the oxidation potential is more preferably 1.1 V (vs SCE) or more, still more preferably 1.15 V (vs SCE) or more.

As for the dye of yellow color, compounds having a structure represented by formula (Y-I) of JP-A-2004-250483 are preferred.

Dyes represented by formulae (Y-II) to (Y-IV) described in paragraph [0034] of JP-A-2004-250483 are more preferred. Specific examples thereof include compounds described in paragraphs [0060] to [0071] of JP-A-2004-250483. Incidentally, the oil-soluble dye of formula (Y-I) described in the patent publication above may be used not only for yellow ink but also for ink of any color, such as black ink and red ink.

As for the dye of magenta color, compounds having a structure represented by formula (3) or (4) described in JP-A-2002-114930 are preferred. Specific examples thereof include the compounds described in paragraphs [0054] to [0073] of JP-A-2002-114930.

Azo dyes represented by formulae (M-1) to (M-2) described in paragraphs [0084] to [0122] of JP-A-2002-121414 are more preferred, and specific examples thereof include the compounds described in paragraphs [0123] to [0132] of JP-A-2002-121414. Incidentally, the oil-soluble dyes of formulae (3), (4) and (M-1) to (M-2) described in these patent publications may be used not only for magenta ink but also for ink of any color, such as black ink and red ink.

As for the dye of cyan color, dyes represented by formulae (I) to (IV) of JP-A-2001-181547 and dyes represented by formulae (IV-1) to (IV-4) described in paragraphs [0063] to [0078] of JP-A-2002-121414 are preferred. Specific examples thereof include the compounds described in paragraphs [0052] to [0066] of JP-A-2001-181547 and the compounds described in paragraphs [0079] to [0081] of JP-A-2002-121414.

Phthalocyanine dyes represented by formulae (C-I) and (C-II) described in paragraphs [0133] to [0196] of JP-A-2002-121414 are more preferred, and the phthalocyanine dye represented by formula (C-II) is still more preferred. Specific examples thereof include the compounds described in paragraphs [0198] to [0201] of JP-A-2002-121414. Incidentally, the oil-soluble dyes of formulae (I) to (IV), (IV-1) to (IV-4), (C-I) and (C-II) may be used not only for cyan ink but also for ink of any color, such as black ink and green ink.

Such a colorant is preferably added in an amount of, in terms of the solid content, from 1 to 20 mass %, more preferably from 2 to 10 mass %, based on the ink composition.

In the ink composition of the present invention, in addition to the above-described essential components, various additives may be used in combination according to the purpose. These arbitrary components are described below.

(Ultraviolet Absorbent)

In the present invention, an ultraviolet absorbent may be used from the standpoint of giving an image enhanced in the weather resistance and prevented from fading.

Examples of the ultraviolet absorbent include benzotriazole-based compounds described in JP-A-58-185677, JP-A-61-190537, JP-A-2-782, JP-A-5-197075 and JP-A-9-34057; benzophenone-based compounds described in JP-A-46-2784, JP-A-5-194483 and U.S. Pat. No. 3,214,463; cinnamic acid-based compounds described in JP-B-48-30492 (the term "JP-B" as used herein means an "examined Japanese patent application"), JP-B-56-21141 and JP-A-10-88106; triazine-based compounds described in JP-A-4-298503, JP-A-8-53427, JP-A-8-239368, JP-A-10-182621 and JP-T-8-501291 (the term (the term "JP-T" as used herein means a "published Japanese translation of a PCT patent application"); compounds described in *Research Disclosure*, No. 24239; and compounds capable of absorbing ultraviolet ray to emit fluorescence, so-called fluorescent brightening agent, as represented by a stilbene-based compound and a benzoxazole-based compound.

The amount of the ultraviolet absorbent added is appropriately selected according to the purpose but is generally on the order of 0.5 to 15 mass % in terms of the solid content.

(Sensitizer)

In the ink composition of the present invention, if desired, a sensitizer may be added for the purpose of enhancing the acid generation efficiency of the photoacid generator and shifting the photosensitive wavelength to a long wavelength side. The sensitizer may be any sensitizer as long as it can sensitize the photoacid generator by an electron or energy transfer mechanism. Preferred examples thereof include an aromatic polycondensed ring compound such as anthracene, 9,10-dialkoxyanthracene, pyrene and perylene; an aromatic ketone compound such as acetophenone, benzophenone, thioxanthone and Michler's ketone; and a heterocyclic compound such as phenothiazine and N-aryloxazolidinone. The amount of the sensitizer added is appropriately selected according to the purpose but is generally from 0.01 to 1 mol %, preferably from 0.1 to 0.5 mol %, based on the photoacid generator.

(Antioxidant)

An antioxidant may be added for the purpose of enhancing the stability of the ink composition. Examples of the antioxidant include those described in EP-A-223739, EP-A-309401, EP-A-309402, EP-A-310551, EP-A-310552, EP-A-459416, German Unexamined Patent Publication No. 3435443, JP-A-54-48535, JP-A-62-262047, JP-A-63-113536, JP-A-63-163351, JP-A-2-262654, JP-A-2-71262, JP-A-3-121449, JP-A-5-61166, JP-A-5-119449, and U.S. Pat. Nos. 4,814,262 and 4,980,275.

The amount of the antioxidant added is appropriately selected according to the purpose but is generally on the order of 0.1 to 8 mass % in terms of the solid content.

(Anti-Fading Agent)

In the ink composition of the present invention, various organic or metal complex-based anti-fading agents may be used. Examples of the organic anti-fading agent include hydroquinones, alkoxyphenols, dialkoxyphenols, phenols, anilines, amines, indanes, chromans, alkoxyanilines and heterocyclic compounds. Examples of the metal complex-based anti-fading agent include a nickel complex and a zinc complex, and specifically, there may be used the compounds described in patents cited in *Research Disclosure*, No. 17643, No. VII, Items I to J, ibid., No. 15162, ibid., No. 18716, page 650, left column, ibid., No. 36544, page 527, ibid., No. 307105, page 872, and ibid., No. 15162; and the compounds included in formulae of representative compounds and in examples of the compounds describe on JP-A-62-215272, pp. 127-137.

The amount of the anti-fading agent added is appropriately selected according to the purpose but is generally on the order of 0.1 to 8 mass % in terms of the solid content.

(Electrically Conducting Salts)

In the ink composition of the present invention, electrically conducting salts such as potassium thiocyanate, lithium nitrate, ammonium thiocyanate and dimethylamine hydrochloride may be added for the purpose of controlling the ejection physical property.

(Solvent)

In the ink composition of the present invention, addition of an organic solvent in an extremely small amount is also effective for the purpose of improving the adhesion to a recording medium.

Examples of the solvent include a ketone-based solvent such as acetone, methyl ethyl ketone and diethyl ketone; an alcohol-based solvent such as methanol, ethanol, 2-propanol, 1-propanol, 1-butanol and tert-butanol; a chlorine-based solvent such as chloroform and methylene chloride; an aromatic solvent such as benzene and toluene; an ester-based solvent such as ethyl acetate, butyl acetate and isopropyl acetate; an ether-based solvent such as diethyl ether, tetrahydrofuran and dioxane; and a glycol ether-based solvent such as ethylene glycol monomethyl ether and ethylene glycol dimethyl ether.

In this case, addition in the range of not causing a problem in the solvent resistance or VOC is effective, and this amount is preferably from 0.1 to 5 mass %, more preferably from 0.1 to 3 mass %, based on the entire ink composition.

(Polymer Compound)

In the ink composition of the present invention, various polymer compounds may be added for the purpose of adjusting the film physical properties. Examples of the polymer compound which can be used include an acryl-based polymer, a polyvinyl butyral resin, a polyurethane resin, a polyamide resin, a polyester resin, an epoxy resin, a phenol resin, a polycarbonate resin, a polyvinyl butyral resin, a polyvinyl formal resin, a shellac, a vinyl-based resin, an acryl-based resin, a rubber-based resin, waxes and other natural resins. Also, two or more species thereof may be used in combination. Among these, a vinyl-based copolymer obtainable by the copolymerization of an acryl-based monomer is preferred. In addition, as for the copolymerization composition of the polymer binder, a copolymer containing, as the structural unit, a "carboxyl group-containing monomer", an "alkyl methacrylate" or an "alkyl acrylate" is also preferably used.

(Surfactant)

In the ink composition of the present invention, a surfactant may also be added.

The surfactant includes those described in JP-A-62-173463 and JP-A-62-183457. Examples thereof include an anionic surfactant such as dialkylsulfosuccinates, alkylnaphthalenesulfonates and fatty acid salts; a nonionic surfactant such as polyoxyethylene alkyl ethers, polyoxyethylene alkylallyl ethers, acetylene glycols and polyoxyethylene-polyoxypropylene block copolymers; and a cationic surfactant such as alkylamine salts and quaternary ammonium salts. Incidentally, an organic fluoro compound may be used in place of the surfactant above. The organic fluoro compound is preferably hydrophobic. Examples of the organic fluoro compound include a fluorine-containing surfactant, an oily fluorine-containing compound (e.g., fluorine oil), a solid fluorine compound resin (e.g., tetrafluoroethylene resin), and those described in JP-B-57-9053 (columns 8 to 17) and JP-A-62-135826.

Other than these, for example, a leveling-additive, a matting agent, waxes for adjusting the film physical properties, and a tackifier for improving adhesion to a recording medium such as polyolefin and PET, which does not inhibit the polymerization, may be added, if desired.

Specific examples of the tackifier include high molecular weight adhesive polymers described in JP-A-2001-49200, pp. 5-6 (for example, a copolymer comprising an ester of a (meth)acrylic acid and an alcohol containing an alkyl group having a carbon number of 1 to 20, an ester of a (meth)acrylic acid and an alicyclic alcohol having a carbon number of 3 to 14, or an ester of a (meth)acrylic acid and an aromatic alcohol having a carbon number of 6 to 14); and a low molecular weight tackifier resin having a polymerizable unsaturated bond.

(Radical Polymerization-Type Ink Composition)

The radical polymerization-type ink composition contains (d) a radical polymerizable compound, (e) a polymerization initiator and a colorant and, if desired, may further contain a colorant, a sensitizing dye, a co-sensitizer and the like.

The constituent components used in the radical polymerization-type ink composition are described below in sequence.

((d) Radical Polymerizable Compound)

The radical polymerizable compound includes, for example, the following compound having an addition-polymerizable ethylenically unsaturated bond.

(Compound Having Addition-Polymerizable Ethylenically Unsaturated Bond)

Examples of the compound having an addition-polymerizable ethylenically unsaturated bond, which can be used in the ink composition of the present invention, include an ester of an unsaturated carboxylic acid (e.g., acrylic acid, methacrylic acid, itaconic acid, crotonic acid, isocrotonic acid, maleic acid) and an aliphatic polyhydric alcohol compound, and an amide of the above-described unsaturated carboxylic acid and an aliphatic polyvalent amine compound.

Specific examples of the ester monomer of an aliphatic polyhydric alcohol compound and an unsaturated carboxylic acid include the followings. Examples of the acrylic ester include ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate, and polyester acrylate oligomer.

Examples of the methacrylic acid ester include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane, and bis[p-(acryloxyethoxy)phenyl]-dimethylmethane. Examples of itaconic acid ester include ethylene glycol diitaconate, propylene glycol diitaconate, 1,3-butanediol diitaconate, 1,4-butanediol diitaconate, tetramethylene glycol diitaconate, pentaerythritol diitaconate, and sorbitol tetraitaconate.

Examples of the crotonic acid ester include ethylene glycol dicrotonate, tetramethylene glycol dicrotonate, pentaerythritol dicrotonate, and sorbitol tetradicrotonate. Examples of the isocrotonic acid ester include ethylene glycol diisocrotonate, pentaerythritol diisocrotonate and sorbitol tetraisocrotonate. Examples of the maleic acid ester include ethylene glycol dimaleate, triethylene glycol dimaleate, pentaerythritol dimaleate and sorbitol tetramaleate. In addition, a mixture of these ester monomers may also be used. Specific examples of the amide monomer of an aliphatic polyvalent amine compound and an unsaturated carboxylic acid include methylenebis-acrylamide, methylenebis-methacrylamide, 1,6-hexamethylenebis-acrylamide, 1,6-hexamethylenebis-methacrylamide, diethylene triamine trisacrylamide, xylylenebisacrylamide, and xylylenebismethacrylamide.

Other examples include a vinyl urethane compound containing two or more polymerizable vinyl groups within one molecule, which is obtained by adding a hydroxyl group-containing vinyl monomer represented by the following formula (A) to a polyisocyanate compound containing two or more isocyanate groups within one molecule, described in JP-B-48-41708. $CH_2{=}C(R)COOCH_2CH(R')OH$ (A) (wherein R and R' each represents H or $CH_3$).

Still other examples include a functional acrylate or methacrylate such as urethane acrylates described in JP-A-51-37193, polyester acrylates described in JP-A-48-64183, JP-B-49-43191 and JP-B-52-30490, and epoxy acrylates obtained by reacting an epoxy resin and a (meth)acrylic acid. Furthermore, those described as a photocurable monomer or oligomer in *Journal of the Adhesion Society of Japan*, Vol. 20, No. 7, pp. 300-308 (1984) may also be used. In the present invention, these monomers can be used in a chemical form such as a prepolymer, namely, dimer, trimer or oligomer, or a mixture or copolymer thereof.

The amount of the radical polymerizable compound used is usually from 1 to 99.99%, preferably from 5 to 90.0%, more preferably from 10 to 70% ("%" as used herein indicates "mass %"), based on all components of the ink composition.

((e) Photopolymerization Initiator)

The photopolymerization initiator for use in the radical polymerization-type ink composition of the present invention is described below.

The photopolymerization initiator as used in the present invention indicates a compound capable of undergoing a chemical change under the action of light or through interaction with the electron excited state of a sensitizing dye and thereby producing at least one species of a radical, an acid and a base.

Preferred examples of the photopolymerization initiator include (i) aromatic ketones, (ii) an aromatic onium salt compound, (iii) an organic peroxide, (iv) a hexaarylbiimidazole compound, (v) a ketoxime ester compound, (vi) a borate compound, (vii) an azinium compound, (viii) a metallocene compound, (vix) an active ester compound, and (x) a carbon-halogen bond-containing compound.

(Colorant)

A colorant the same as those described for the (c) colorant regarding the cationic polymerization-type ink composition may be utilized.

In the ink composition of the present invention, in addition to the above-described essential components, various additives may be used in combination according to the purpose. These arbitrary components are described below.

(Sensitizing Dye)

In the present invention, a sensitizing dye may be added for the purpose of improving the sensitivity of the photopolymerization initiator. Preferred examples of the sensitizing dye include those belonging to the following compounds and having an absorption wavelength in the region from 350 to 450 nm.

That is, the compounds are polynuclear aromatics (e.g., pyrene, perylene, triphenylene), xanthenes (e.g., fluorescein, eosin, erythrosin, Rhodamine B, Rose Bengale), cyanines (e.g., thiacarbocyanine, oxacarbocyanine), merocyanines (e.g., merocyanine, carbomerocyanine), thiazines (e.g., thionine, Methylene Blue, Toluidine Blue), acridines (e.g., Acridine Orange, chloroflavin, acriflavine), anthraquinones (e.g., anthraquinone), squaryliums (e.g., squarylium), and coumarins (e.g., 7-diethylamino-4-methylcoumarin).

(Co-Sensitizer)

Furthermore, in the ink of the present invention, a known compound having an activity of, for example, more enhancing the sensitivity or suppressing the polymerization inhibition by oxygen may be added as a co-sensitizer.

Examples of such a co-sensitizer include amines such as compounds described in M. R. Sander, et al., *Journal of Polymer Society*, Vol. 10, page 3173 (1972), JP-B-44-20189, JP-A-51-82102, JP-A-52-134692, JP-A-59-138205, JP-A-60-84305, JP-A-62-18537, JP-A-64-33104, and *Research Disclosure*, No. 33825. Specific examples thereof include triethanolamine, ethyl p-dimethylaminobenzoate, p-formyldimethylaniline and p-methylthiodimethylaniline.

Other examples include thiols and sulfides such as thiol compounds described in JP-A-53-702, JP-B-55-500806, and JP-A-5-142772 and disulfide compounds described in JP-A-56-75643, Specific examples thereof include 2-mercaptobenzothiazole, 2-mercaptobenzoxazole, 2-mercaptobenzimidazole, 2-mercapto-4(3H)-quinazoline and β-mercaptonaphthalene.

Still other examples include an amino acid compound (e.g., N-phenylglycine), organometallic compounds described in JP-B-48-42965 (e.g., tributyltin acetate), hydrogen donors described in JP-B-55-34414, sulfur compounds described in JP-A-6-308727 (e.g., trithian), phosphorus compounds described in JP-A-6-250387 (e.g., diethyl phosphite), and Si—H and Ge—H compounds described in Japanese Patent Application No. 6-191605.

Also, in view of enhancing the storability, a polymerization inhibitor is preferably added in an amount of 200 to 20,000 ppm. The ink for inkjet recording of the present invention is preferably ejected after heating it in the range from 40 to 80° C. and thereby decreasing the viscosity, and also for preventing head clogging due to thermal polymerization, addition of a polymerization inhibitor is preferred. Examples of the polymerization inhibitor include hydroquinone, benzoquinone, p-methoxyphenol, TEMPO, TEMPOL and cupferron A1.

(Others)

In addition, known compounds may be used as needed. For example, a surfactant, a leveling additive, a matting agent and, for adjusting the film physical properties, a polyester-based resin, a polyurethane-based resin, a vinyl-based resin, an acryl-based resin, a rubber-based resin or waxes, may be appropriately selected and used. Furthermore, in order to improve the adhesion to a recording medium such as polyolefin and PET, a tackifier which does not inhibit the polymerization is also preferably contained. Specific examples thereof include high molecular weight adhesive polymers described in JP-A-2001-49200, pp. 5-6 (for example, a copolymer comprising an ester of a (meth)acrylic acid and an alcohol containing an alkyl group having a carbon number of 1 to 20, an ester of a (meth)acrylic acid and an alicyclic alcohol having a carbon number of 3 to 14, or an ester of a (meth)acrylic acid and an aromatic alcohol having a carbon number of 6 to 14); and a low molecular weight tackifier resin having a polymerizable unsaturated bond.

Also, addition of an organic solvent in an extremely small amount is effective for the purpose of improving adhesion to a recording medium. In this case, addition in the range of not causing a problem in the solvent resistance or VOC is effective, and this amount is preferably from 0.1 to 5 mass %, more preferably from 0.1 to 3 mass %, based on the entire ink composition.

Furthermore, as the means for preventing reduction in the sensitivity due to light-shielding effect of the coloring material in the ink, it is also one preferred embodiment to form a radical/cation hybrid-type curing ink by combining a cationic polymerizable monomer having a long life as the polymerization initiator with a polymerization initiator.

(Aqueous Ink Composition)

The aqueous ink composition contains a polymerizable compound and a water-soluble photopolymerization initiator capable of generating a radical under the action of active energy and if desired, may further contain a coloring material and the like.

(Polymerizable Compound)

As for the polymerizable compound contained in the aqueous ink composition of the present invention, a polymerizable compound contained in known aqueous ink compositions may be used.

In the aqueous ink composition, a reactive material may be added so as to optimize the formulation by taking into account end user characteristics such as curing rate, adhesion and flexibility. For example, a (meth)acrylate (namely, acrylate and/or methacrylate) monomer or oligomer, an epoxide and an oxetane are used as such a reactive material.

Examples of the acrylate monomer include a phenoxyethyl acrylate, an octyldecyl acrylate, a tetrahydrofuryl acrylate, an isobornyl acrylate, a hexanediol diacrylate, a trimethylolpropane triacrylate, a pentaerythritol triacrylate, a polyethylene glycol diacrylate (e.g., tetraethylene glycol diacrylate), a dipropylene glycol diacrylate, a tri(propylene glycol)triacrylate, a neopentyl glycol diacrylate, a bis(pentaerythritol) hexaacrylate, an acrylate of ethoxylated or propoxylated glycol and polyol (e.g., propoxylated neopentyl glycol diacrylate, ethoxylated trimethylolpropane triacrylate), and a mixture thereof.

Examples of the acrylate oligomer include an ethoxylated polyethylene glycol, an ethoxylated trimethylolpropane acrylate, a polyether acrylate including its ethoxylated product, and a urethane acrylate oligomer.

Examples of the methacrylate include a hexanediol dimethacrylate, a trimethylolpropane trimethacrylate, a triethylene glycol dimethacrylate, a diethylene glycol dimethacrylate, an ethylene glycol dimethacrylate, a 1,4-butanediol dimethacrylate, and a mixture thereof.

The amount of the oligomer added is preferably from 1 to 80 wt %, more preferably from 1 to 10 wt %, based on the entire weight of the ink composition.

(Water-Soluble Photopolymerization Initiator Capable of Producing a Radical Under the Action of Active Energy)

The polymerization initiator which can be used in the ink composition of the present invention is described below. As one example, a photopolymerization initiator up to a wavelength of around 400 nm may be used. Examples of such a photopolymerization initiator include photopolymerization initiators represented by the following formulae, which are a substance having functionality in a long wavelength region, namely, sensitivity of producing a radical when irradiated with ultraviolet rays (hereinafter simply referred to as a "TX system"). In the present invention, particularly, a photopolymerization initiator appropriately selected from these is preferably used.

TX-1:

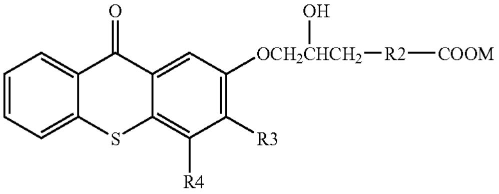

TX-2:

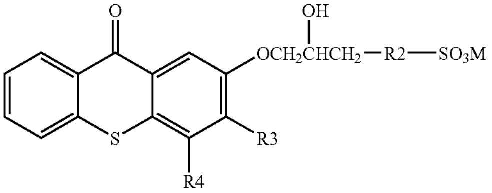

TX-3:

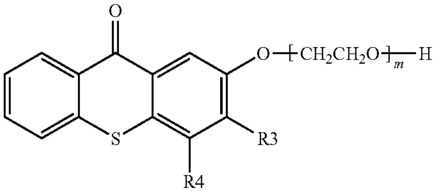

In formulae TX-1 to TX-3, R2 represents $-(CH_2)_x-$ (wherein x is 0 or 1), $-O-(CH_2)_y-$ (wherein y is 1 or 2), or a substituted or unsubstituted phenylene group. When R2 is a phenylene group, at least one of the hydrogen atoms in the benzene ring may be substituted by one group or atom or two or more groups or atoms selected from, for example, a carboxyl group or a salt thereof, a sulfonic acid or a salt thereof, a linear or branched alkyl group having a carbon number of 1 to 4, a halogen atom (e.g., fluorine, chlorine, bromine), an alkoxyl group having a carbon number of 1 to 4, and an aryloxy group such as phenoxy group. M represents a hydrogen atom or an alkali metal (e.g., Li, Na, K). R3 and R4 each independently represents a hydrogen atom or a substituted or unsubstituted alkyl group. Examples of the alkyl group include a linear or branched alkyl group having a carbon number of approximately from 1 to 10, particularly, a carbon number of approximately from 1 to 3. Examples of the substituent for this alkyl group include a halogen atom (e.g., fluorine, chlorine, bromine), a hydroxyl group, and an alkoxyl group (having a carbon number of approximately from 1 to 3). m represents an integer of 1 to 10.

In the present invention, a water-soluble derivative of a photopolymerization initiator, Irgacure 2959 (trade name, produced by Ciba Specialty Chemicals), represented by the following formula (hereinafter simply referred to as an "IC system") may be used. Specifically, IC-1 to IC-3 of the following formulae may be used. Formula:

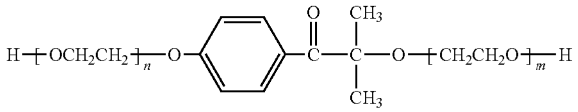

(n: 2 to 5, m: 0 to 5)

IC-1:

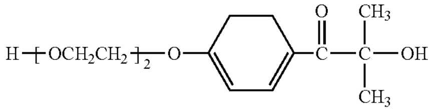

IC-2:

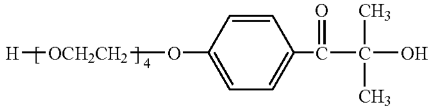

IC-3:

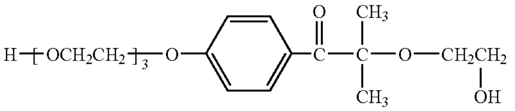

(Formulation for Clear Ink)

By using the water-soluble polymerizable compound in the form of a transparent aqueous ink without incorporating the above-described coloring material, a clear ink can be prepared. In particular, when the ink is prepared to have inkjet recording property, an aqueous photocuring-type clear ink for inkjet recording is obtained. This ink contains no coloring material and therefore, a clear film can be obtained by using the ink. Examples of the usage of the coloring material-free clear ink include use as an undercoat for imparting suitability for image printing to a recording material, and use as an overcoat for protecting the surface of an image formed by a normal ink or further imparting decoration, gloss or the like. In the clear ink, a colorless pigment, a fine particle or the like not for the purpose of coloration may be incorporated by dispersion according to the usage above. By this addition, various properties such as image quality, fastness and processability (handling property) of a printed matter can be enhanced in both cases of undercoat and overcoat.

As for the formulation conditions in such application to a clear ink, the ink is preferably prepared to contain a water-soluble polymerizable compound as the main component of the ink in a proportion of 10 to 85% and a photopolymerization initiator (for example, an ultraviolet polymerization catalyst) in an amount of 1 to 10 parts by mass per 100 parts by mass of the water-soluble polymerizable compound and at the same time, contain a photopolymerization initiator in an amount of at least 0.5 parts per 100 parts of the ink.

(Material Construction in Coloring Material-Containing Ink)

In the case of using the water-soluble polymerizable compound for a coloring material-containing ink, the concentrations of the polymerization initiator and polymerizable substance in the ink are preferably adjusted according to the absorption characteristics of the coloring material contained. As described above, the blending amount is set such that the amount of water or solvent is, on the mass basis, from 40 to 90%, preferably from 60 to 75%. Also, the content of the polymerizable compound in the ink is set to, on the mass basis, from 1 to 30%, preferably from 5 to 20%, based on the entire amount of the ink. The amount of the polymerization initiator depends on the content of the polymerizable compound but is generally, on the mass basis, from 0.1 to 7%, preferably from 0.3 to 5%, based on the entire amount of the ink.

In the case where a pigment is used as the coloring material of the ink, the concentration of the pure pigment portion in the ink is generally from 0.3 to 10 mass % based on the entire amount of the ink. The coloring power of the pigment depends on the dispersed state of pigment particles, but when the concentration is approximately from 0.3 to 1%, this is in the range of use as a light color ink, whereas the value exceeding the range above gives a concentration employed for normal coloration.

(Preferred Physical Properties of Ink Composition)

Taking into account the ejection property, the ink composition of the present invention preferably has an ink viscosity of 20 mPa·s or less, more preferably 10 mPa·s or less, at the ejection temperature, and an appropriate compositional ratio is preferably determined to give an ink viscosity in this range.

The surface tension in common of the ink composition of the present invention is preferably from 20 to 40 mN/m, more preferably from 25 to 35 mN/m. In the case of recording an image on various recording mediums such as polyolefins, PET, coated paper and non-coated paper, the surface tension is preferably 20 mN/m or more in view of bleeding and penetration and is preferably 40 mN/m or less in view of wettability.

The thus-prepared ink composition of the present invention is suitably used as an ink for inkjet recording. In the case of using the ink composition as an ink for inkjet recording, the ink composition is ejected on a recording medium by an inkjet printer and the ink composition ejected is then cured by irradiating thereon active energy, whereby recording is performed.

The printed matter obtained using this ink has an image area cured by the irradiation of active energy such as ultraviolet ray and is assured of excellent strength of the image area and therefore, the ink composition can be used for various uses such as formation of an ink-receiving layer (image area) of a lithographic printing plate, other than the formation of an image.

The present application claims foreign priority based on Japanese Patent Application (JP 2007-159261) filed Jun. 15, 2007, the contents of which is incorporated herein by reference.

What is claimed is:

1. An image forming method that forms an image by a plurality of ink-jet heads of line type, which contain first inks having secondary chromatic colors, based on an input image, the method comprising:

forming a test pattern, which uses a color chart with entire colors of second inks, by the ink-jet heads while using a normal color conversion table for converting a first color space of the input image into a second color space of the formed image, the second inks including the first inks;

comparing data obtained by scanning the formed test pattern with second color space data of the test pattern, and identifying a non-matching color portion as a non-ejection color and a line position containing a non-ejection nozzle thereof;

preparing a special color conversion table for converting the first color space in which one color of the second inks is omitted from the normal color conversion table into a second color space reproducing a color closest to the input image, the special color conversion table being provided with respect to each omission ink; and setting and using the special color conversion table for the omission ink corresponding to the non-ejection color at the line position containing the identified non-ejection nozzle.

2. The image forming method as claimed in claim 1, wherein, in a case where the special color conversion table is set for use, another test pattern is formed, and where the identification of the non-ejection color and the line position containing the non-ejection nozzle thereof is insufficient, the special color conversion table is set again at a line adjacent to the identified line, and the setting is repeated until correct identification is obtained.

3. The image forming method as claimed in claim 1, wherein the special color conversion table is used for performing an approximated compensation in a color space, which is outside a color gamut of the special color conversion table, based on at least one of a combination of ink amounts providing the minimum color difference, and the amount of an ink of the same color adjacent to the non-ejection nozzle.

4. The image forming method as claimed in claim 1, wherein the normal color conversion table and the special color conversion table are created by measuring the color of the formed the test pattern in the normal state of the ink-jet head and comparing first color space data of the test pattern with the measured color data.

5. An image forming apparatus that forms an image by using first inks having secondary chromatic colors based on an input image, the apparatus comprising:

a plurality of ink-jet heads of line type that contain the first inks;

a test pattern that uses a color chart with entire colors of second inks including the first inks;

a head control unit that includes:

a normal color conversion table that converts a first color space of the input image into a second color space of the formed image by the ink-jet head; and a special color conversion table that converts the first color space in which one color of the second inks is omitted from the normal color conversion table into a second color space reproduces a color closest to the input image, the special color conversion table being provided with respect to each omission color;

a scanner detection unit that reads a image of the test pattern formed by the ink-jet head;

a comparing unit that compares the data read by the scanner detection unit with second color space data of the test pattern, and identifies a non-matching colored portion as a non-ejection color and a line position containing a non-ejection nozzle thereof; and a table setting unit that sets a special color conversion table in which the position of the non-matching colored portion and the non-ejection color identified by the comparing unit are basically employed, and transmits the set special color conversion table to the head control unit.

* * * * *